(12) United States Patent
Zhang et al.

(10) Patent No.: US 12,100,457 B2
(45) Date of Patent: Sep. 24, 2024

(54) VOLTAGE SUPPLY CIRCUITS, THREE-DIMENSIONAL MEMORY DEVICES, PERIPHERAL CIRCUIT, AND METHODS FOR ADJUSTING VOLTAGE SUPPLY CIRCUIT

(71) Applicant: YANGTZE MEMORY TECHNOLOGIES CO., LTD., Wuhan (CN)

(72) Inventors: Ning Zhang, Wuhan (CN); Ruxin Wei, Wuhan (CN); Yongyong Wang, Wuhan (CN); Wei Huang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 117 days.

(21) Appl. No.: 17/725,109

(22) Filed: Apr. 20, 2022

(65) Prior Publication Data

US 2023/0343399 A1 Oct. 26, 2023

(51) Int. Cl.
| | |
|---|---|
| *G11C 16/30* | (2006.01) |
| *G05F 1/567* | (2006.01) |
| *G11C 16/04* | (2006.01) |
| *H03K 19/20* | (2006.01) |

(52) U.S. Cl.
CPC .............. *G11C 16/30* (2013.01); *G05F 1/567* (2013.01); *G11C 16/0483* (2013.01); *H03K 19/20* (2013.01)

(58) Field of Classification Search
CPC ...................................................... G11C 16/30
See application file for complete search history.

(56) References Cited

U.S. PATENT DOCUMENTS

| | | | |
|---|---|---|---|
| 4,678,983 A | 7/1987 | Rouzies | |
| 9,874,927 B2 | 1/2018 | Vogman | |
| 2003/0218931 A1* | 11/2003 | Okamoto | .................. G11C 7/04 365/222 |
| 2006/0192727 A1* | 8/2006 | Wang | .................... G09G 3/3406 345/30 |
| 2007/0004054 A1* | 1/2007 | Orr | ..................... H03K 17/0822 438/10 |
| 2007/0174641 A1* | 7/2007 | Cornwell | .................. G06F 1/26 713/300 |

(Continued)

FOREIGN PATENT DOCUMENTS

| | | |
|---|---|---|
| CN | 102640418 A | 8/2012 |
| CN | 104679089 A | 6/2015 |

(Continued)

*Primary Examiner* — Douglas King
(74) *Attorney, Agent, or Firm* — BAYES PLLC (57) ABSTRACT

A voltage supply circuit includes a temperature compensation circuit and a voltage regulation circuit. The temperature compensation circuit includes a comparator circuit comparing a device temperature value with a reference value to output a comparison result, and a compensation controller circuit receiving the comparison result, a compensation value control signal, and a compensation enable signal, and outputting a voltage control signal according to the comparison result. The voltage regulation circuit receives the voltage control signal and provides a voltage output according to the control signal.

18 Claims, 9 Drawing Sheets

(56) References Cited

U.S. PATENT DOCUMENTS

| | | | | |
|---|---|---|---|---|
| 2008/0137460 A1* | 6/2008 | Incarnati | ............... | G11C 5/143 |
| | | | | 365/212 |
| 2010/0110815 A1* | 5/2010 | Lee | ............... | G11C 16/30 |
| | | | | 365/189.09 |
| 2012/0159216 A1* | 6/2012 | Wells | ............... | G06F 1/26 |
| | | | | 713/320 |
| 2013/0300393 A1 | 11/2013 | Lee | | |
| 2014/0328126 A1* | 11/2014 | Kim | ............... | G11C 16/06 |
| | | | | 365/185.23 |
| 2017/0255403 A1* | 9/2017 | Sharon | ............... | G06F 3/064 |
| 2019/0138041 A1* | 5/2019 | Goyal | ............... | G05F 1/575 |
| 2021/0304811 A1* | 9/2021 | Kim | ............... | G11C 16/26 |

FOREIGN PATENT DOCUMENTS

| | | | |
|---|---|---|---|
| CN | 106094962 A | 11/2016 | |
| CN | 106683692 A | 5/2017 | |
| CN | 111009276 A | 7/2019 | |
| CN | 210270647 U | 4/2020 | |
| CN | 113568465 A | 10/2021 | |
| JP | 2010147652 A | 7/2010 | |
| TW | I408526 B | 9/2013 | |
| TW | I583125 B | 5/2017 | |
| TW | I754450 B | 2/2022 | |

\* cited by examiner

VOLTAGE SUPPLY CIRCUITS, THREE-DIMENSIONAL MEMORY DEVICES, PERIPHERAL CIRCUIT, AND METHODS FOR ADJUSTING VOLTAGE SUPPLY CIRCUIT

BACKGROUND

The present disclosure relates to voltage supply circuits, memory devices, peripheral circuits, and methods for adjusting the voltage level of the voltage supply circuits, and specifically, relates to the voltage supply circuits in the three-dimensional (3D) memory devices.

Low-dropout regulators are a widely used component in contemporary electronic devices. Uses for low-dropout regulators range from communication devices (including wired and wireless communication devices) to portable electronics, as well as industrial, avionic, nautical, and automotive applications.

Low-dropout regulators can broadly encompass a class of direct current (DC) linear voltage regulators that may be capable of regulating an output voltage, even despite the supply voltage being close to the output voltage. As no switching takes place with such voltage regulators, they may be useful in cases where switching noise is undesired.

When applying the low-dropout regulators in the 3D memory devices, in order to increase the working speed, the driving current of the 3D memory devices and the integration density of the chip needs to be increased accordingly. However, the result of the high power consumption and the voltage shift may affect the performance of the 3D memory devices.

SUMMARY

Implementations of voltage supply circuits and methods for adjusting the voltage level of the voltage supply circuits are disclosed herein.

In one aspect, a voltage supply circuit is disclosed. The voltage supply circuit includes a temperature compensation circuit and a voltage regulation circuit. The temperature compensation circuit includes a comparator circuit comparing a device temperature value with a reference value to output a comparison result, and a compensation controller circuit receiving the comparison result, a compensation value control signal, and a compensation enable signal, and outputting a voltage control signal. The voltage regulation circuit receives the voltage control signal and provides a voltage output according to the voltage control signal.

In some implementations, the comparator circuit includes a first comparator input terminal receiving the device temperature value, a second comparator input terminal receiving the reference value, and a comparator output terminal outputting the comparison result. When the device temperature value is lower than the reference value, the comparison result includes a comparison flag to the compensation controller circuit.

In some implementations, the compensation controller circuit includes a first compensation input terminal receiving the comparison result, and a second compensation input terminal receiving the compensation enable signal. The comparison flag and the compensation enable signal jointly enable the compensation controller circuit.

In some implementations, the compensation controller circuit further includes a third compensation input terminal receiving the compensation value control signal. The compensation controller circuit generates the voltage control signal jointly according to the comparison flag, the compensation enable signal, and the compensation value control signal.

In some implementations, the comparison flag, the compensation enable signal, and the compensation value control signal jointly control a plurality of logic gates to generate the voltage control signal.

In some implementations, the compensation value control signal includes a plurality of control commands to the plurality of logic gates to generate the voltage control signal. In some implementations, the voltage control signal includes at least one switching command to control at least one switch in the voltage regulation circuit.

In some implementations, the compensation controller circuit includes a first logic gate receiving the comparison result and the compensation enable signal, and outputting a first logic value; a second logic gate receiving the first logic value and a first portion of the compensation value control signal, and outputting a first portion of the voltage control signal; and a third logic gate receiving the first logic value and a second portion of the compensation value control signal, and outputting a second portion of the voltage control signal.

In some implementations, the compensation value control signal includes a digital signal, the first portion of the compensation value control signal includes a first bit of the digital signal, and the second portion of the compensation value control signal includes a second bit of the digital signal.

In some implementations, the first logic gate includes an AND gate, the second logic gate includes a NAND gate, and the third logic gate includes a NAND gate.

In some implementations, the voltage regulation circuit includes a resistor string having a first resistor and a second resistor in series connection, a first switch coupled to two ends of the first resistor, and a second switch coupled to two ends of the second resistor.

In some implementations, the first switch and the second switch are controlled by the voltage control signal provided by the compensation controller circuit.

In some implementations, the voltage regulation circuit further includes an output terminal for outputting the voltage output, and a voltage level of the voltage output is adjustable by switching on/off the first switch and/or the second switch.

In another aspect, a 3D memory device is disclosed. The 3D memory device includes a memory cell array for storing data, and a peripheral circuit coupled to the memory cell array and including a voltage supply circuit providing a voltage source to the peripheral circuit. The voltage supply circuit includes a temperature compensation circuit and a voltage regulation circuit. The temperature compensation circuit includes a comparator circuit comparing a device temperature value with a reference value to output a comparison result, and a compensation controller circuit receiving the comparison result, a compensation value control signal, and a compensation enable signal, and outputting a voltage control signal according to the comparison result. The voltage regulation circuit receives the voltage control signal and provides a voltage output according to the voltage control signal.

In some implementations, the comparator circuit includes a first comparator input terminal receiving the device temperature value, a second comparator input terminal receiving the reference value, and a comparator output terminal outputting the comparison result. When the device temperature value is lower than the reference value, the comparison result includes a comparison flag to the compensation controller circuit.

In some implementations, the compensation controller circuit includes a first compensation input terminal receiving the comparison result, a second compensation input terminal receiving the compensation enable signal, and a third compensation input terminal receiving the compensation value control signal. The compensation controller circuit generates the voltage control signal jointly according to the comparison result, the compensation enable signal, and the compensation value control signal.

In some implementations, the comparison result, the compensation enable signal, and the compensation value control signal jointly control a plurality of logic gates to generate the voltage control signal. In some implementations, the compensation value control signal includes a plurality of control commands to the plurality of logic gates to generate the voltage control signal.

In some implementations, the voltage regulation circuit includes a resistor string having a first resistor and a second resistor in series connection, a first switch coupled to two ends of the first resistor, and a second switch coupled to two ends of the second resistor.

In some implementations, the first switch and the second switch are controlled by the voltage control signal provided by the compensation controller circuit.

In some implementations, the voltage regulation circuit further includes an output terminal for outputting the voltage output, and a voltage level of the voltage output is adjustable by switching on/off the first switch and/or the second switch.

In still another aspect, a peripheral circuit is disclosed. The peripheral circuit includes a plurality of transistors coupled to a memory cell array. The peripheral circuit includes a voltage supply circuit. The voltage supply circuit includes a temperature compensation circuit and a voltage regulation circuit. The temperature compensation circuit includes a comparator circuit comparing a device temperature value with a reference value to output a comparison result, and a compensation controller circuit receiving the comparison result, a compensation value control signal, and a compensation enable signal, and outputting a voltage control signal. The voltage regulation circuit receives the voltage control signal and provides a voltage output according to the voltage control signal.

In some implementations, the comparator circuit includes a first comparator input terminal receiving the device temperature value, a second comparator input terminal receiving the reference value, and a comparator output terminal outputting the comparison result. When the device temperature value is lower than the reference value, the comparison result includes a comparison flag to the compensation controller circuit.

In some implementations, the compensation controller circuit includes a first compensation input terminal receiving the comparison result, a second compensation input terminal receiving the compensation enable signal, and a third compensation input terminal receiving the compensation value control signal. The compensation controller circuit generates the voltage control signal jointly according to the comparison result, the compensation enable signal, and the compensation value control signal.

In some implementations, the comparison result, the compensation enable signal, and the compensation value control signal jointly control a plurality of logic gates to generate the voltage control signal. In some implementations, the compensation value control signal includes a plurality of control commands to the plurality of logic gates to generate the voltage control signal.

In some implementations, the voltage regulation circuit includes a resistor string having a first resistor and a second resistor in series connection, a first switch coupled to two ends of the first resistor, and a second switch coupled to two ends of the second resistor.

In some implementations, the first switch and the second switch are controlled by the voltage control signal provided by the compensation controller circuit.

In some implementations, the voltage regulation circuit further includes an output terminal for outputting the voltage output, and a voltage level of the voltage output is adjustable by switching on/off the first switch and/or the second switch.

In yet another aspect, a method for adjusting a voltage level of a voltage supply circuit is disclosed. A device temperature value is compared with a reference value to output a comparison result. The comparison result is provided to a compensation controller circuit, and a voltage control signal is outputted according to the comparison result. A voltage output of a voltage regulation circuit is adjusted according to the voltage control signal.

In some implementations, a comparison flag is outputted to the compensation controller circuit. In some implementations, the comparison result is provided to the compensation controller circuit, a compensation enable signal is provided to the compensation controller circuit, and the compensation controller circuit is enabled jointly according to the comparison result and the compensation enable signal.

In some implementations, a compensation value control signal is provided to the compensation controller circuit, and the voltage control signal is generated jointly according to the comparison result, the compensation enable signal, and the compensation value control signal.

In some implementations, the comparison result, the compensation enable signal, and the compensation value control signal jointly control a plurality of logic gates to generate the voltage control signal.

In some implementations, a plurality of control commands are provided to a plurality of logic gates as the compensation value control signal, and the voltage control signal is generated based on the plurality of control commands to the plurality of logic gates.

In some implementations, a first switch and a second switch in the voltage regulation circuit are selectively switched on/off to change a resistance of a resistor string in the voltage regulation circuit, and a voltage source is provided in series connection with the resistor string to output the voltage output.

In some implementations, the resistor string includes a first resistor and a second resistor in series connection with the voltage source. In some implementations, the first switch is switched on to bypass the first resistor in the resistor string, and the second switch is switched on to bypass the second resistor in the resistor string.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In a memory device, for example, a NAND Flash memory or a 3D Flash memory, the VDD voltage is generally required to complete the functions of operations, such as read, program, or erase the data in the memory device. The VDD voltage may be generated from an external integrated circuit voltage supply voltage (VCC) via an external VCC pin. A voltage supply circuit, such as a low drop-out (LDO) regulator circuit, may be used to generate VDD from VCC. Although a 3D NAND Flash memory is one possible implementation in which the voltage supply circuit can be used, the voltage supply circuit can be used in many other applications both in other kinds of memory devices and in numerous other technological fields.

The operating temperature of the memory device, such as the operating temperature of the devices in the peripheral circuit, may be changed by various sources. In some implementations, the operating temperature of the devices in the peripheral circuit may be changed by the external environment temperature. In some implementations, the operating temperature of the devices in the peripheral circuit may be changed by the internal heat accumulation caused by the current consumption in the peripheral circuit. In some implementations, the operating temperature of the memory device refers to the operating temperature of the transistors, such as the complementary metal-oxide semiconductor (CMOS), in the peripheral circuit. As the operating temperature of the memory device increases, the resistance of the metal layers in the memory device increases accordingly, and therefore the performance of the power bus in the peripheral circuit decreases. However, when the operating temperature of the memory device decreases, the leakage current of the memory device may increase and cause the system power consumption. The implementations of the application can accurately monitor the temperature changes of the devices in the peripheral circuit. In addition, the implementations of the application can flexibly adjust the supply voltage value (the VDD value) according to different code provided in a compensation controller circuit. Further, the implementations of the application can provide the above improvements without increasing the power consumption and device area of the peripheral circuit.

Figure 1:
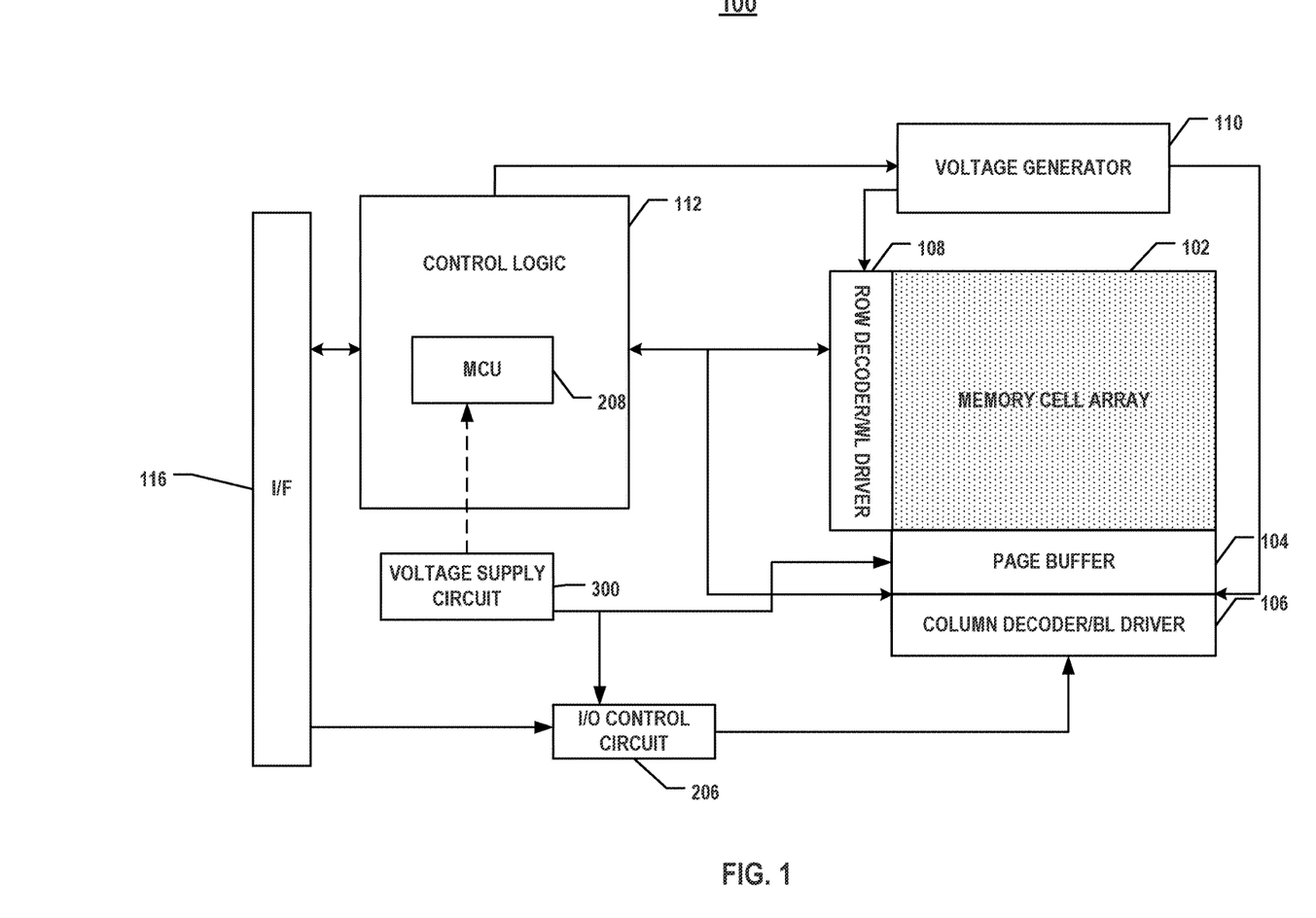
FIG. 1 illustrates an exemplary 3D memory device, according to some aspects of the present disclosure.

FIG. 1 illustrates an exemplary 3D memory device 100, according to some aspects of the present disclosure. 3D memory device 100 may be or include a 3D NAND memory device. As shown in FIG. 1, 3D memory device 100 can include a memory cell array 102 including an array of NAND memory cells in the form of NAND memory strings. 3D memory device 100 can also include a peripheral circuit 200 configured to facilitate the operations of NAND memory cells, such as read, program, and erase. The peripheral circuit can include, for example, a page buffer 104, a column decoder/bit line driver 106, a row decoder/word line driver 108, a voltage generator 110, control logic 112 having a microcontroller unit (MCU) 208, registers, an interface 116, and a data bus. It is understood that in some examples, additional peripheral circuits may be included as well. A voltage supply circuit 300 may be included in the peripheral circuit receiving a voltage source from voltage generator 110 and providing a regulated voltage to page buffer 104, and/or to the input/output (I/O) control circuit and MCU 208 in control logic 112 in the peripheral circuit.

Page buffer 104 can be configured to read and program data from and to memory cell array 102 according to the control of control logic 112. In one example, page buffer 104 may store one page of program data (write data) to be programmed into one page of memory cell array 102. In another example, page buffer 104 also performs program verify operations to ensure that the data has been properly programmed into memory cells coupled to selected word lines. Row decoder/word line driver 108 can be configured to be controlled by control logic 112 and select a block of memory cell array 102 and a word line of the selected block.

Row decoder/word line driver 108 can be further configured to drive the selected word line using a word line voltage generated from voltage generator 110. Voltage generator 110 can be configured to be controlled by control logic 112 and generate the word line voltages (e.g., read voltage, program voltage, pass voltage, local voltage, and verification voltage) to be supplied to memory cell array 102. Column decoder/bit line driver 106 can be configured to be controlled by control logic 112 and select one or more NAND memory strings by applying bit line voltages generated from voltage generator 110. For example, column decoder/bit line driver 106 may apply column signals for selecting a set of N bits of data from page buffer 104 to be outputted in a read operation.

Control logic 112 can be coupled to each peripheral circuit and configured to control operations of peripheral circuits. Registers can be coupled to control logic 112 and include status registers, command registers, and address registers for storing status information, command operation codes (OP codes), and command addresses for controlling the operations of each peripheral circuit.

Interface 116 can be coupled to control logic 112 and act as a control buffer to buffer and relay control commands received from a host (not shown) to control logic 112 and status information received from control logic 112 to the host. Interface 116 can also be coupled to page buffer 104 via column decoder/bit line driver 106 and act as an input/output (I/O) interface and a data buffer to buffer and relay the program data received from a host (not shown) to page buffer 104 and the read data from page buffer 104 to the host. As shown in FIG. 1, bidirectional data bus can connect interface 116 and column decoder/bit line driver 106 for transferring data to and from memory cell array 102.

Voltage supply circuit 300 may be included in the peripheral circuit to provide a regulated voltage in the peripheral circuit. An external voltage VCC may be provided through an external power pad interface, such as a CMOS chip interface, and a part of the external voltage VCC may provide the read-write and erase voltage for memory cell array 102. The external voltage VCC may be boosted by a charge pump, such as voltage generator 110, to provide voltages to memory cell array 102. Another part of the external voltage VCC may be provided to a voltage regulator module, such as voltage supply circuit 300, to supply power to page buffer 104, MCU 208, and/or I/O control circuit 206. Voltage supply circuit 300 may also be used to generate voltages in other portions of a memory device or in other devices that are not memory devices, with these use cases being provided by way of example and illustration and not by way of limitation.

Figure 2:
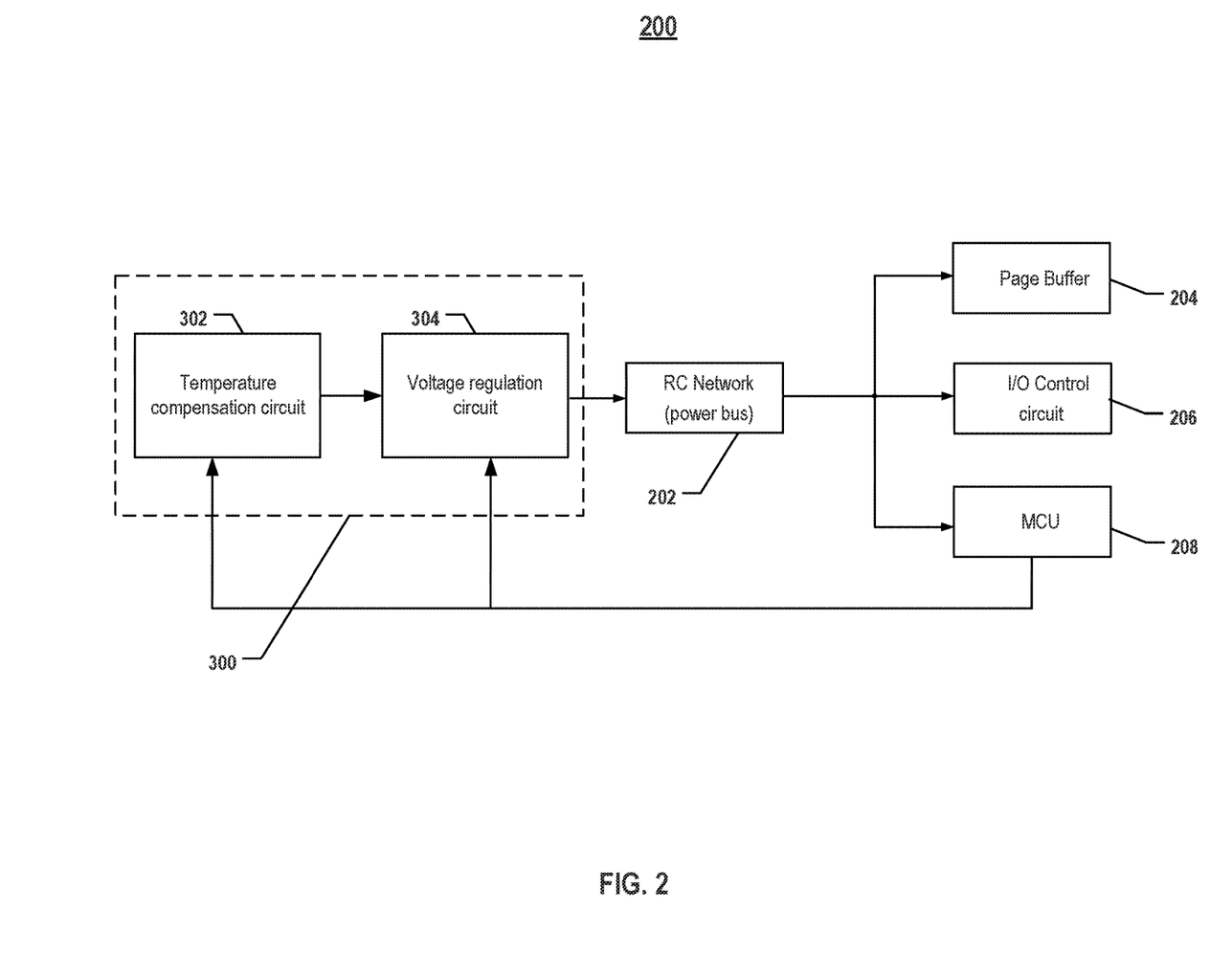
FIG. 2 illustrates an exemplary peripheral circuit, according to some aspects of the present disclosure.

FIG. 2 illustrates peripheral circuit 200, according to some aspects of the present disclosure. In some implementations, peripheral circuit 200 may include additional devices other than those shown in FIG. 2. As shown in FIG. 2, peripheral circuit 200 may include voltage supply circuit 300, and voltage supply circuit 300 may provide a regulated or adjusted voltage level to page buffer 204, I/O control circuit 206, and/or MCU 208 in peripheral circuit 200 through a resistor/capacitor (RC) network 202. In some implementations, RC network 202 may be the power distribution network of peripheral circuit 200, and may be formed by a conductive material, such as metal layers, to transmit voltages. In some implementations, page buffer 204 may be similar to page buffer 104 in FIG. 1. I/O control circuit 206 may control the operation of interface 116 to buffer and relay the program data received from the host to page buffer 204 and the read data from page buffer 204 to the host. MCU 208 may control the overall operation of 3D memory device 100, including column decoder/bit line driver 106, row decoder/word line driver 108, voltage generator 110, control logic 112, registers, interface 116, and/or data bus.

Figure 3:
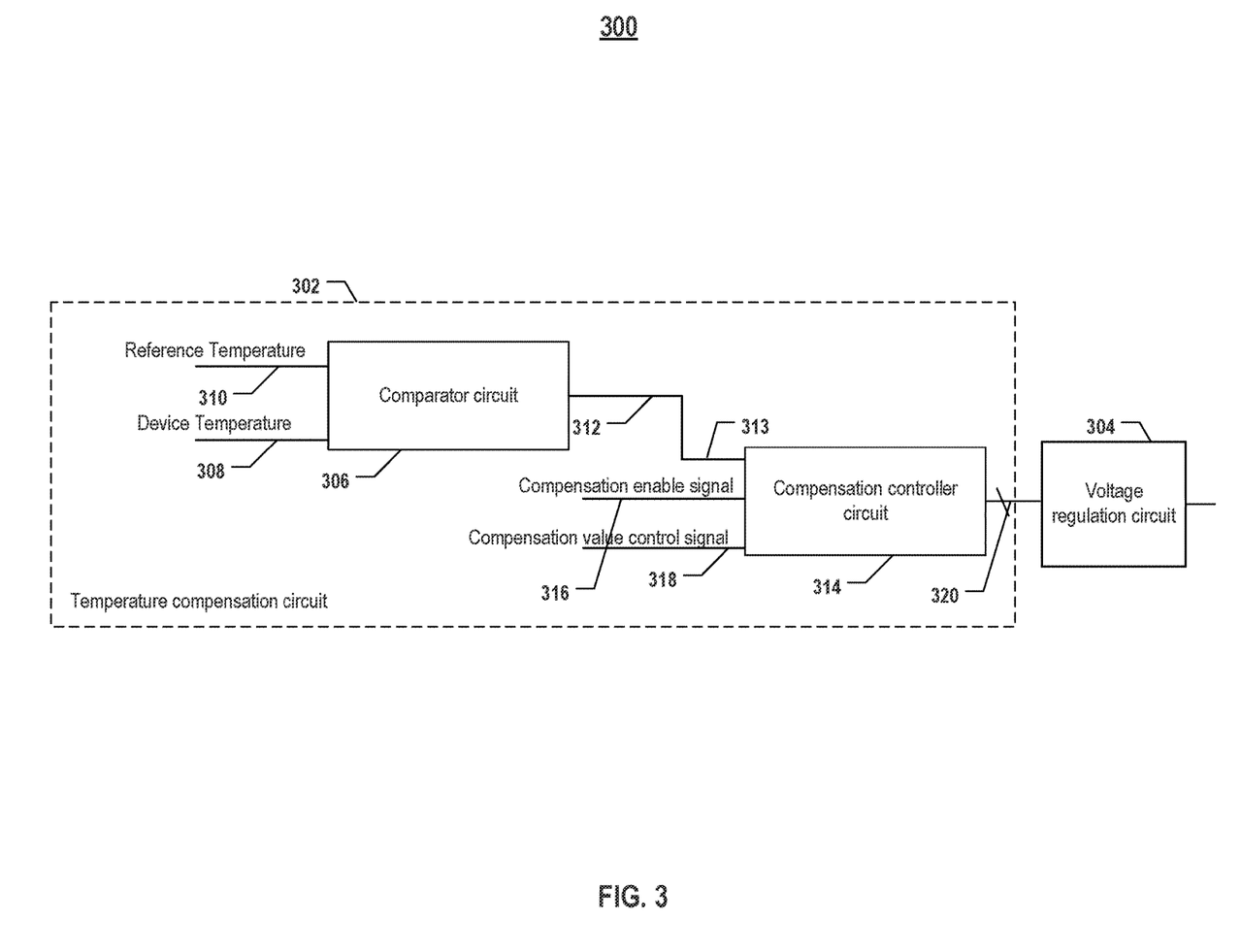
FIG. 3 illustrates an exemplary voltage supply circuit, according to some aspects of the present disclosure.

FIG. 3 illustrates voltage supply circuit 300, according to some aspects of the present disclosure. In some implementations, voltage supply circuit 300 may include a temperature compensation circuit 302 and a voltage regulation circuit 304. In some implementations, temperature compensation circuit 302 is used for sensing the device temperature of 3D memory device 100 and comparing the device temperature with a low reference temperature. In some implementations, the low reference temperature may be defined by the user according to different operating environments or different applications. For example, the low reference temperature may be 15 degrees Celsius. For a further example, the low reference temperature may be 50 degrees Celsius. In some implementations, the low reference temperature is predefined based on required operating environments and applications and may have a range between 15 and 60 degrees Celsius. In some implementations, when the device temperature is lower than the low reference temperatures, temperature compensation circuit 302 may output a control signal to voltage regulation circuit 304 to adjust the output voltage level of VDD.

In some implementations, when the device temperature is compared to the low reference temperature, temperature compensation circuit 302 may output different control signals to voltage regulation circuit 304 according to different compensation value control signal to provide different voltage levels of VDD. For example, when the low reference temperature is defined to 15 degrees Celsius and the device temperature is below 15 degrees Celsius, temperature compensation circuit 302 may output a control signal to voltage regulation circuit 304 to adjust the output voltage level of VDD to 1.925 volts. For another example, when the device temperature is higher than or equal to 15 degrees Celsius, temperature compensation circuit 302 may not be enabled, and the output voltage level of VDD may be maintained at 1.95 volts.

In some implementations, a high reference temperature may be further predefined based on required operating environments and applications, and when the device temperature is higher than the high reference temperature, voltage regulation circuit 304 may be controlled by MCU 208. In an example, the high reference temperature may be 100 degrees Celsius. In another example, the high reference temperature may be 125 degrees Celsius. In some implementations, the high reference temperature may have a range between 90 and 150 degrees Celsius. For a further example, when the device temperature is higher than 100 degrees Celsius, MCU 208 may control voltage regulation circuit 304 to adjust the output voltage level of VDD to 1.975 volts.

In some implementations, temperature compensation circuit 302 may include a comparator circuit 306 and a compensation controller circuit 314. Comparator circuit 306 may include a first comparator input terminal 308 receiving the device temperature value, a second comparator input terminal 310 receiving the reference value, and a comparator output terminal 312 outputting the comparison result. In some implementations, when the device temperature value is lower than the reference value, the comparison result comprises a comparison flag to compensation controller circuit 314.

In some implementations, compensation controller circuit 314 may include a first compensation input terminal 313 receiving the comparison result, a second compensation input terminal 316 receiving a compensation enable signal provided by MCU 208, and a third compensation input terminal 318 receiving a compensation value control signal provided by MCU 208. In some implementations, the comparison result and the compensation enable signal may jointly enable compensation controller circuit 314. In some implementations, the comparison result, the compensation enable signal, and the compensation value control signal may jointly generate a control signal 320, and compensation controller circuit 314 can provide control signal 320 to voltage regulation circuit 304.

Figure 4:
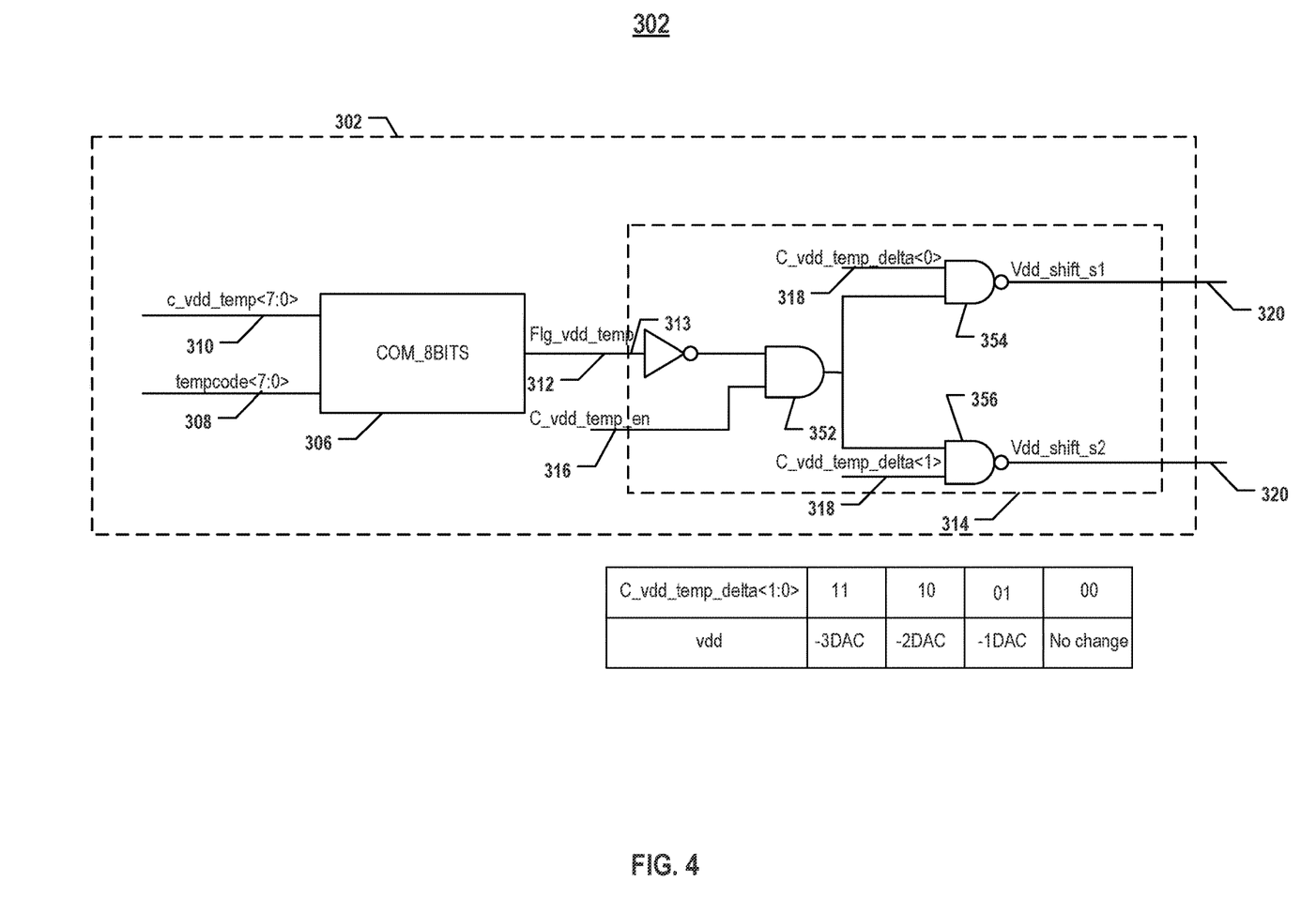
FIG. 4 illustrates an exemplary temperature compensation circuit, according to some aspects of the present disclosure.

FIG. 4 illustrates an exemplary temperature compensation circuit 302, according to some aspects of the present disclosure. As shown in FIG. 4, temperature compensation circuit 302 may include comparator circuit 306 and compensation controller circuit 314. In some implementations, comparator circuit 306 may be a digital comparator, e.g., 8-bits comparator, as shown in FIG. 4. First comparator input terminal 308 of the 8-bits comparator receives the device temperature value in a digital form, and second comparator input terminal 310 of the 8-bits comparator receives the reference value in a digital form. After comparing the device temperature value with the reference value, the 8-bits comparator may output the comparison result. In some implementations, the comparison result may be a comparison flag, and the comparison flag may be used to combine with the compensation enable signal provided by MCU 208 to jointly enable compensation controller circuit 314.

For example, the low reference temperature may be set to 15 degrees Celsius, and when the device temperature is below 15 degrees Celsius, the 8-bits comparator may output a comparison flag. When the compensation enable signal provided by MCU 208 is 1, compensation controller circuit 314 may be enabled.

As shown in FIG. 4, compensation controller circuit 314 may include first compensation input terminal 313 receiving the comparison flag, second compensation input terminal 316 receiving the compensation enable signal, and third compensation input terminal 318 receiving the compensation value control signal. When compensation controller circuit 314 is enabled jointly by the comparison flag and the compensation enable signal, the compensation value control signal may be further used to determine the adjustment value of the voltage level.

In some implementations, the compensation value control signal may include multiple portions, such as multiple bits of digital signal. For example, as shown in FIG. 4, the compensation value control signal may be a 2-bits signal representing four different adjustment values of the voltage level, and the first bit of the compensation value control signal represents a first portion of the compensation value control signal, and the second bit of the compensation value control signal represents a second portion of the compensation value control signal. The adjustment values of the voltage level may increase or decrease the voltage level output by voltage regulation circuit 304. For example, when the compensation value control signal is (1,1), the voltage level output by voltage regulation circuit 304 may be adjusted to decrease −3DAC. The unit DAC used here represents the resolution of the adjustment. In some implementations, 1 DAC represents 25 mV. In another implementation, 1 DAC may represent 50 mV, which may be defined in the design of voltage supply circuit 300 according to different applications.

As shown in FIG. 4, compensation controller circuit 314 includes a plurality of logic gates to generate control signal 320. In some implementations, the logic gates may include AND, OR, XOR, NOT, NAND, NOR, XNOR, and/or other suitable logic gates, which are not limited here. In some implementations, the comparison flag (Flg_vdd_temp in FIG. 4) and the compensation enable signal (C_vdd_temp_en in FIG. 4) provided by MCU 208 may be input to an AND gate 352, and the logic result of AND gate 352 may then be input to two NAND gates 354/356. NAND gates 354/356 receive the logic result from AND gate 352 and the compensation value control signal (C_vdd_emp_delta<0> and C_vdd_emp_delta<1> in FIG. 4) provided by MCU 208, and output voltage control signal 320 (Vdd_shift_s_1 and Vdd_shift_s_1 in FIG. 4) to control voltage regulation circuit 304. Voltage control signal 320 may then be used to switch on or switch off the switches in voltage regulation circuit 304 to adjust the output voltage level of voltage regulation circuit 304.

Figure 5:
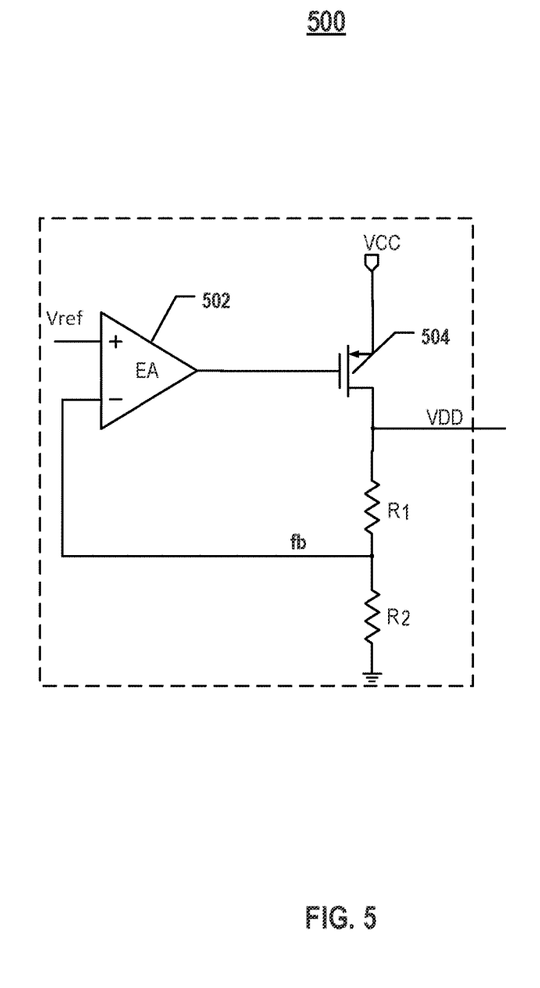
FIG. 5 illustrates an exemplary voltage regulation circuit, according to some aspects of the present disclosure.

FIG. 5 illustrates an exemplary voltage regulation circuit 500, according to some aspects of the present disclosure. In some implementations, voltage regulation circuit 500 may be voltage regulation circuit 304 in FIG. 3. In some implementations, voltage regulation circuit 500 includes an amplifier 502, a transistor 504, and resistors R1 and R2. In some implementations, amplifier 502 compares a feedback voltage (fb) with a reference voltage (Vref) and generates an adjustment signal to control transistor 504. In some implementations, the sample portion of the regulated voltage VDD, such as the feedback voltage (fb), that is compared with the reference voltage Vref is generated by a voltage divider formed by resistors R1 and R2. The regulated voltage VDD can be provided at a source node of transistor 504. The advantage of using transistor 504 is that the regulated voltage VDD may be provided with low drop-out and high power-supply rejection. The low output impedance of transistor 504 may further result in a high unity-gain-bandwidth performance.

Figure 6:
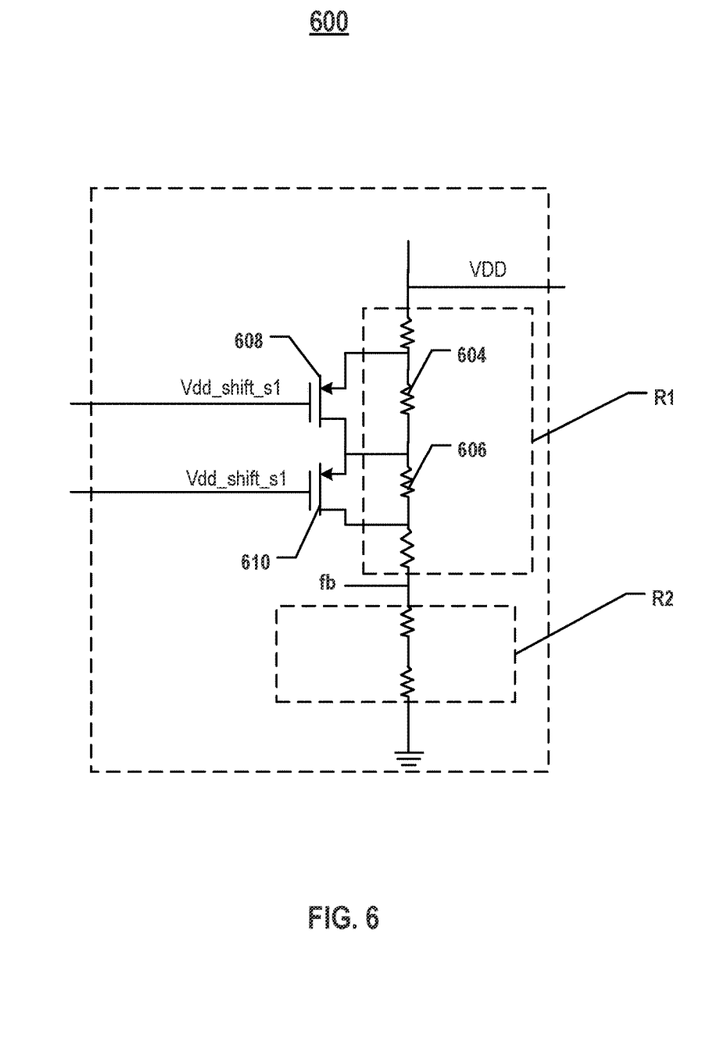
FIG. 6 illustrates an exemplary voltage divider, according to some aspects of the present disclosure.

FIG. 6 illustrates an exemplary voltage divider 600, according to some aspects of the present disclosure. In some implementations, voltage divider 600 may include the voltage divider formed by resistors R1 and R2 shown in FIG. 5. In some implementations, voltage divider 600 includes a resistor string including a first resistor 604 and a second resistor 606 in series connection, a first switch 608, and a second switch 610. First switch 608 is coupled to two ends of first resistor 604, and second switch 610 is coupled to two ends of second resistor 606. When first switch 608 is switched on, first switch 608 can create a bypass path of first resistor 604, and when second switch 610 is switched on, second switch 610 can create a bypass path of second resistor 606. In other words, by switching on or off first switch 608 and/or second switch 610, the resistance of the resistor string can be changed accordingly.

Feedback voltage (fb) is the voltage value at the point between R1 and R2, and the voltage value of feedback voltage (fb) is VDD*(R2/(R1+R2)). When VCC in FIG. 5 is maintained at the same voltage value and the resistance of R1 is changed by switching on/off first switch 608 and second switch 610, the voltage value of feedback voltage (fb) will be changed accordingly. Hence, feedback voltage (fb) may be used as a negative feedback sampling voltage of amplifier 502. In some implementations, first switch 608 and second switch 610 may be two transistors operated as switches.

As described above, when the device temperature value is lower than the reference value and the compensation enable signal provided by MCU 208 is enable, compensation controller circuit 314 is enabled to control the switching on/off of first switch 608 and second switch 610, and therefore the resistance of R1 is changed. In some implementations, when the device temperature value is higher than or equal to the reference value, and/or when the device temperature value is higher than the high reference value, the resistance of R1/R2 may be controlled by MCU 208.

Figure 7:
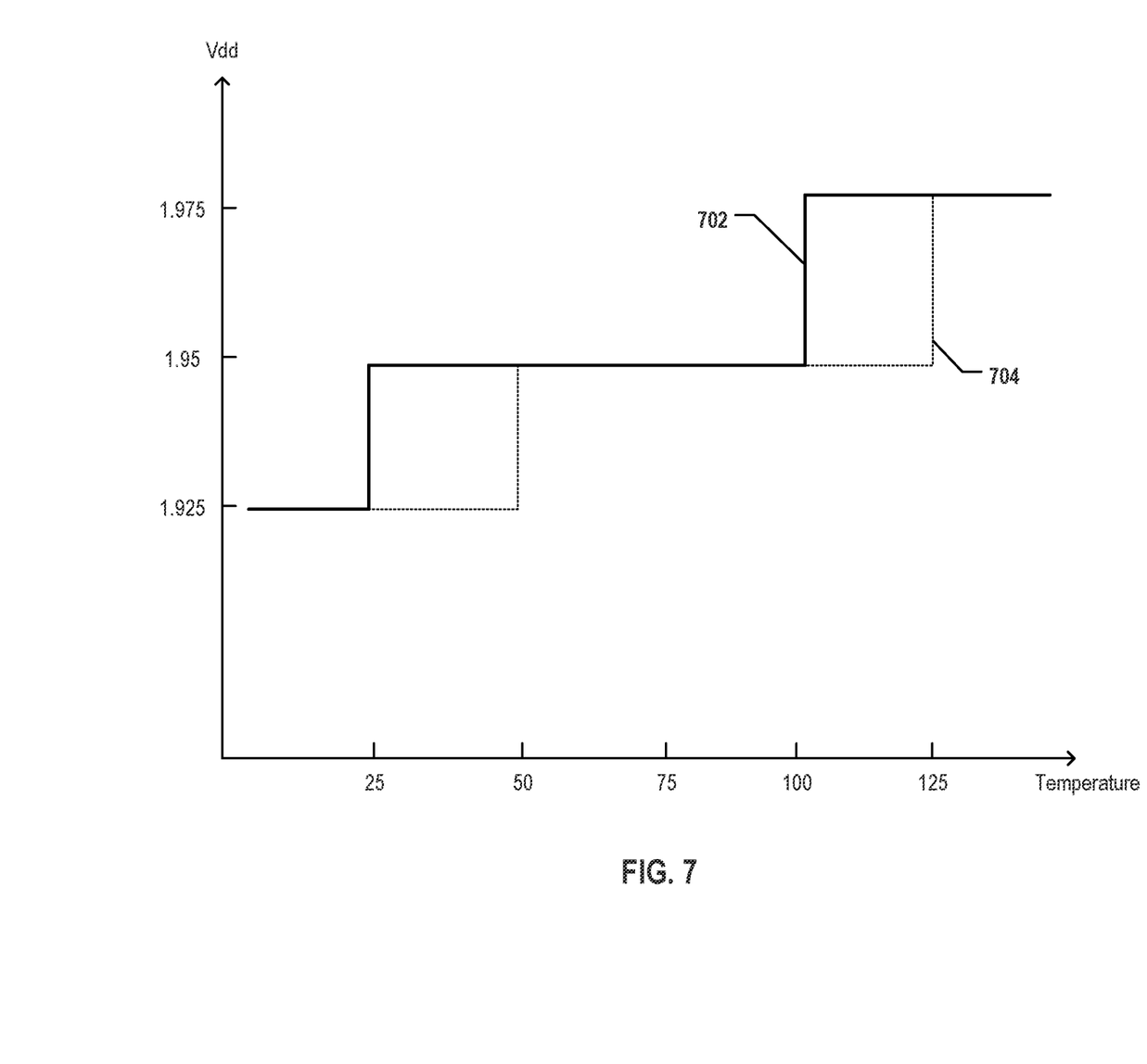
FIG. 7 illustrates an exemplary voltage output diagram, according to some aspects of the present disclosure.

FIG. 7 illustrates an exemplary voltage output diagram, according to some aspects of the present disclosure. As shown in FIG. 7, the low reference temperature and the regulated voltage level of voltage supply circuit 300 may be changed based on different applications. For example, as shown by voltage curve 702 in FIG. 7, the low reference temperature may be set at 25 degrees Celsius and the high reference temperature may be set at 100 degrees Celsius. When the device temperature is below 25 degrees Celsius, voltage supply circuit 300 may be controlled to adjust the resistance of R1 to change VDD to 1.925 volts. When the device temperature is between 25 degrees Celsius and 100 degrees Celsius, VDD may be maintained at 1.95 volts. When the device temperature is higher than 100 degrees Celsius, the resistance of R1/R2 may be controlled by MCU 208 to change VDD to 1.975 volts.

For another example, as shown by voltage curve 704 in FIG. 7, the low reference temperature may be set at 50 degrees Celsius and the high reference temperature may be set at 125 degrees Celsius. When the device temperature is below 50 degrees Celsius, voltage supply circuit 300 may be controlled to adjust the resistance of R1 to change VDD to 1.925 volts. When the device temperature is between 50 degrees Celsius and 125 degrees Celsius, VDD may be maintained at 1.95 volts. When the device temperature is higher than 125 degrees Celsius, the resistance of R1/R2 may be controlled by MCU 208 to change VDD to 1.975 volts.

It is understood that the voltage values 1.925, 1.95, and 1.975 are for illustrative purpose only, the voltage values may be changed according to actual requirements. For example, the compensation value control signal may be set to (1, 1), (1,0), (0,1), or (0,0) to change the on/off status of first switch 608 and second switch 610 and therefore change the voltage value 1.925 to other voltage value.

By adjusting the voltage level of VDD by comparing the device temperature with a low reference temperature and compensating the voltage supply circuit accordingly, the supply voltage value of VDD can be ensured to match the resistance change of the device, and, therefore, the performance of the power bus in the peripheral circuit can be improved.

Figure 8:
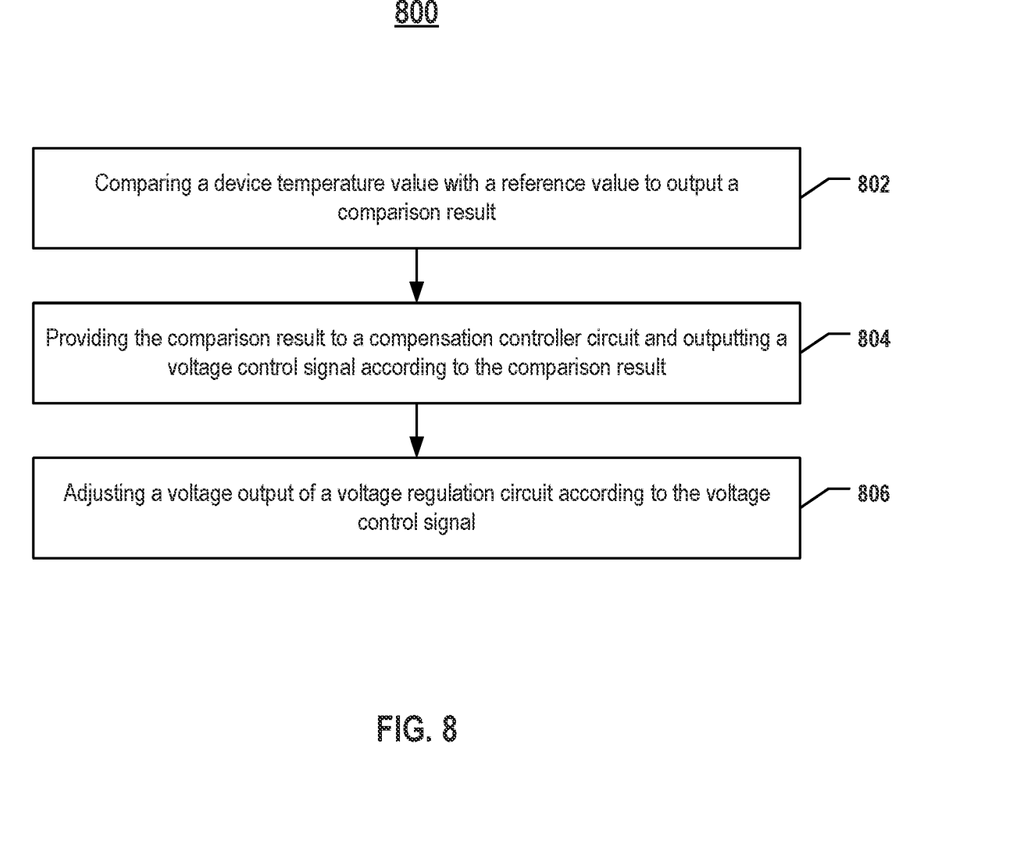
FIG. 8 illustrates a flowchart of an exemplary method for adjusting a voltage level of a voltage supply circuit, according to some aspects of the present disclosure.

FIG. 8 illustrates a flowchart of an exemplary method 800 for adjusting a voltage level of a voltage supply circuit, according to some aspects of the present disclosure. As shown in operation 802 in FIG. 8, a device temperature value is compared with a reference value to output a comparison result. When the device temperature value is lower than the reference value, a comparison flag is outputted to the compensation controller circuit 314.

For example, the predefined temperature value may be 15 degrees Celsius. For a further example, the predefined temperature value may be 50 degrees Celsius. In some implementations, the low reference temperature is predefined based on required operating environments and applications and may have a range between 15 and 60 degrees Celsius. In some implementations, when the device temperature is lower than the predefined temperature value, temperature compensation circuit 302 may output a control signal to voltage regulation circuit 304 to adjust the output voltage level of VDD.

In some implementations, when the device temperature is compared to the predefined temperature value, temperature compensation circuit 302 may output different control signals to voltage regulation circuit 304 according to different compensation value control signal to provide different voltage level of VDD. For example, when the low reference temperature is defined to 15 degrees Celsius and the device temperature is below 15 degrees Celsius, temperature compensation circuit 302 may output a control signal to voltage regulation circuit 304 to adjust the output voltage level of VDD to 1.925 volts. For another example, when the device temperature is higher than or equal to 15 degrees Celsius, temperature compensation circuit 302 may output a control signal to voltage regulation circuit 304 to adjust the output voltage level of VDD to 1.95 volts. For a further example, when the device temperature is higher than 100 degrees Celsius, temperature compensation circuit 302 may not be enabled, and the output voltage level of VDD may be maintained at 1.975 volts.

In some implementations, a high reference temperature may be further predefined based on required operating environments and applications, and when the device temperature is higher than the high reference temperature, voltage regulation circuit 304 may be controlled by MCU 208. In an example, the high reference temperature may be 100 degrees Celsius. In another example, the high reference temperature may be 125 degrees Celsius. In some implementations, the high reference temperature may have a range between 90 and 150 degrees Celsius. For a further example, when the device temperature is higher than 100 degrees Celsius, MCU 208 may control voltage regulation circuit 304 to adjust the output voltage level of VDD to 1.975 volts.

In some implementations, comparator circuit 306 may be a digital comparator, e.g., 8-bits comparator, as shown in FIG. 4. First comparator input terminal 308 of the 8-bits comparator receives the device temperature value in a digital form, and second comparator input terminal 310 of the 8-bits comparator receives the reference value in a digital form. After comparing the device temperature value with the reference value, the 8-bits comparator may output the comparison result. In some implementations, the comparison result may be a comparison flag, and the comparison flag may be used to combine with the compensation enable signal provided by MCU 208 to jointly enable compensation controller circuit 314.

For example, the low reference temperature may be set to 15 degrees Celsius, and when the device temperature is below 15 degrees Celsius, the 8-bits comparator may output a comparison flag. When the compensation enable signal provided by MCU 208 is 1, compensation controller circuit 314 may be enabled.

As shown in operation 804 in FIG. 8, the comparison result is provided to compensation controller circuit 314 and a voltage control signal is output according to the comparison result. The comparison flag is output to compensation controller circuit 314. In some implementations, the comparison result is provided to compensation controller circuit 314, the compensation enable signal is provided to compensation controller circuit 314, and compensation controller circuit 314 is enabled jointly according to the comparison result and the compensation enable signal.

In some implementations, the compensation value control signal is provided to compensation controller circuit 314, and the control signal is generated jointly according to the comparison result, the compensation enable signal, and the compensation value control signal. In some implementations, the comparison result, the compensation enable signal, and the compensation value control signal jointly control a plurality of logic gates to generate the control signal. In some implementations, a plurality of control commands are provided to a plurality of logic gates as the compensation value control signal, and the control signal is generated based on the plurality of control commands to the plurality of logic gates.

In some implementations, compensation controller circuit 314 may include first compensation input terminal 313 receiving the comparison flag, second compensation input terminal 316 receiving the compensation enable signal provided by MCU 208, and third compensation input terminal 318 receiving the compensation value control signal provided by MCU 208. When compensation controller circuit 314 is enabled jointly by the comparison flag and the compensation enable signal, the compensation value control signal may be further used to determine the adjustment value of the voltage level.

For example, as shown in FIG. 4, the compensation value control signal may be a 2-bits signal representing four different adjustment values of the voltage level. The adjustment values of the voltage level may increase or decrease the voltage level output by voltage regulation circuit 304. For example, when the compensation value control signal is (1,1), the voltage level output by voltage regulation circuit 304 may be adjusted to decrease −3DAC. The unit DAC used herein represents the resolution of the adjustment. In some implementations, 1 DAC represents 25 mV. In another implementation, 1 DAC may represent 50 mV, which may be defined in the design of voltage supply circuit 300 according to different applications.

In some implementations, compensation controller circuit 314 includes a plurality of logic gates to generate control signal 320. In some implementations, the logic gates may include AND, OR, XOR, NOT, NAND, NOR, XNOR, and/or other suitable logic gates, which are not limited here. In some implementations, the comparison flag (Flg_vdd_temp in FIG. 4) and the compensation enable signal (C_vdd_temp_en in FIG. 4) provided by MCU 208 may be input to an AND gate 352, and the logic result of AND gate 352 may then be input to two NAND gates 354/356. NAND gates 354/356 receive the logic result from AND gate 352 and the compensation value control signal (C_vdd_emp_delta<0> and C_vdd_emp_delta<1> in FIG. 4) provided by MCU 208, and output voltage control signal 320 (Vdd_shift_s_1 and Vdd_shift_s_1 in FIG. 4) to control voltage regulation circuit 304. Voltage control signal 320 may then be used to switch on or switch off the switches in voltage regulation circuit 304 to adjust the output voltage level of voltage regulation circuit 304.

As shown in operation 806 in FIG. 8, the voltage output of voltage regulation circuit 304 is adjusted according to the voltage control signal. In some implementations, first switch 608 and second switch 610 in voltage regulation circuit 304 are selectively switched on/off to change a resistance of a resistor string in voltage regulation circuit 304, and the voltage source VCC is provided in series connection with the resistor string to output the voltage output VDD. In some implementations, the resistor string includes first resistor 604 and second resistor 606 in series connection with the voltage source VCC. In some implementations, first switch 608 may be switched on to bypass first resistor 604 in the resistor string, and second switch 610 may be switched on to bypass second resistor 606 in the resistor string.

By adjusting the voltage level of VDD by comparing the device temperature with a low reference temperature and compensating the voltage supply circuit accordingly, the supply voltage value of VDD can be ensured to match the resistance change of the device, and, therefore, the performance of the power bus in the peripheral circuit can be improved.

Figure 9:
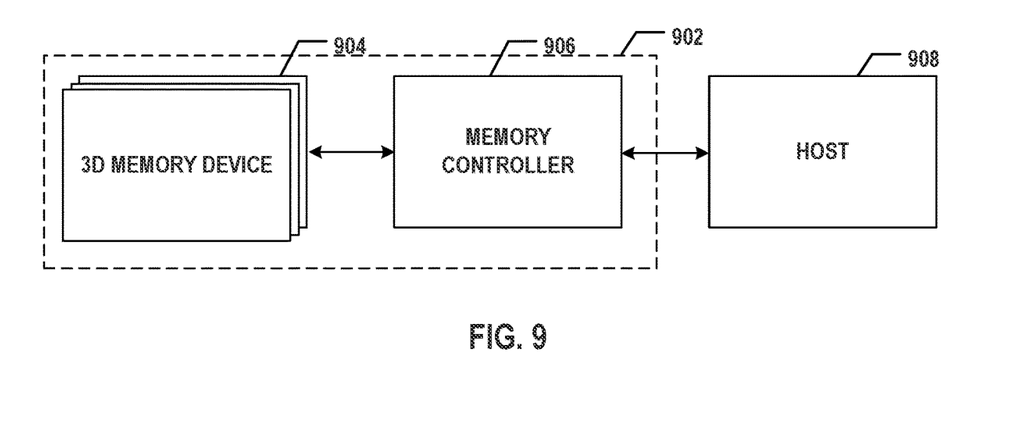
FIG. 9 illustrates a block diagram of an exemplary system having a memory device, according to some aspects of the present disclosure.

FIG. 9 illustrates a block diagram of an exemplary system 900 having a memory device, according to some aspects of the present disclosure. System 900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 9, system 900 can include a host 908 and a memory system 902 having one or more memory devices 904 and a memory controller 906. Host 908 can be a processor of an electronic device, such as a central processing unit (CPU), or a system-on-chip (SoC), such as an application processor (AP). Host 908 can be configured to send or receive data to or from memory devices 904.

Memory device 904 can be any memory device disclosed in the present disclosure. As disclosed above in detail, memory device 904, such as a NAND Flash memory device, may have a controlled and regulated voltage VDD for the peripheral circuit. Memory controller 906 is coupled to memory device 904 and host 908 and is configured to control memory device 904, according to some implementations. Memory controller 906 can manage the data stored in memory device 904 and communicate with host 908. For example, memory controller 906 may be coupled to memory device 904, such as 3D memory device 100 described above, and memory controller 906 may be configured to control the operations of 3D memory device 100 through peripheral circuit 200. By adjusting the voltage level of VDD by comparing the device temperature with a low reference temperature and compensating the voltage supply circuit accordingly, the supply voltage value of VDD can be ensured to match the resistance change of the device, and therefore the performance of the power bus in the peripheral circuit can be improved.

In some implementations, memory controller 906 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 906 is designed for operating in a high duty-cycle environment SSDs or embedded multi-media-cards (eMMCs) used as data storage for mobile devices, such as smartphones, tablets, laptop computers, etc., and enterprise storage arrays. Memory controller 906 can be configured to control operations of memory device 904, such as read, erase, and program operations. Memory controller 906 can also be configured to manage various functions with respect to the data stored or to be stored in memory device 904 including, but not limited to bad-block management, garbage collection, logical-to-physical address conversion, wear leveling, etc. In some implementations, memory controller 906 is further configured to process error correction codes (ECCs) with respect to the data read from or written to memory device 904. Any other suitable functions may be performed by memory controller 906 as well, for example, formatting memory device 904. Memory controller 906 can communicate with an external device (e.g., host 908) according to a particular communication protocol. For example, memory controller 906 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 10A:
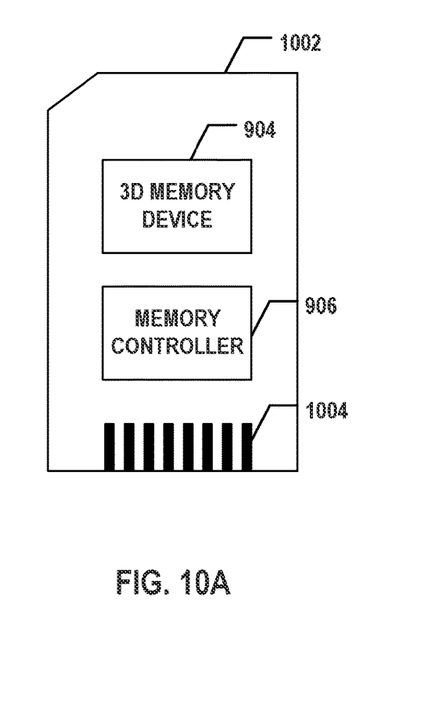
FIG. 10A illustrates a diagram of an exemplary memory card having a memory device, according to some aspects of the present disclosure.
Figure 10B:
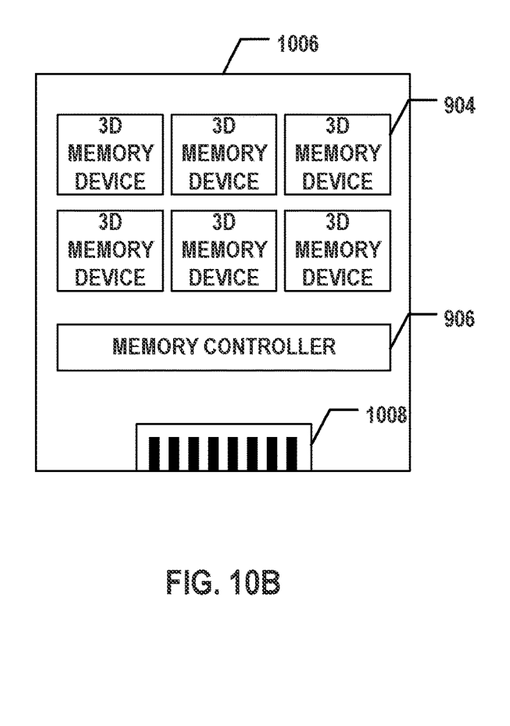
FIG. 10B illustrates a diagram of an exemplary solid-state drive (SSD) having a memory device, according to some aspects of the present disclosure.

Memory controller 906 and one or more memory devices 904 can be integrated into various types of storage devices, for example, be included in the same package, such as a universal Flash storage (UFS) package or an eMMC package. That is, memory system 902 can be implemented and packaged into different types of end electronic products. In one example as shown in FIG. 10A, memory controller 906 and a single memory device 904 may be integrated into a memory card 1002. Memory card 1002 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1002 can further include a memory card connector 1004 coupling memory card 1002 with a host (e.g., host 908 in FIG. 9). In another example as shown in FIG. 10B, memory controller 906 and multiple memory devices 904 may be integrated into an SSD 1006. SSD 1006 can further include an SSD connector 1008 coupling SSD 1006 with a host (e.g., host 908 in FIG. 9). In some implementations, the storage capacity and/or the operation speed of SSD 1006 is greater than those of memory card 1002.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A voltage supply circuit, comprising:
   a temperature compensation circuit comprising:
      a comparator circuit comparing a device temperature value with a reference value to output a comparison result; and
      a compensation controller circuit receiving the comparison result, a compensation value control signal, and a compensation enable signal, and outputting a voltage control signal; and
      a voltage regulation circuit receiving the voltage control signal and providing a voltage output according to the voltage control signal,
   wherein the voltage regulation circuit comprises:
      a resistor string comprising a first resistor and a second resistor in series connection;
      a first switch coupled to two ends of the first resistor; and
      a second switch coupled to two ends of the second resistor.

2. The voltage supply circuit of claim 1, wherein the comparator circuit comprises:
   a first comparator input terminal receiving the device temperature value;
   a second comparator input terminal receiving the reference value; and
   a comparator output terminal outputting the comparison result,
   wherein when the device temperature value is lower than the reference value, the comparison result comprises a comparison flag to the compensation controller circuit.

3. The voltage supply circuit of claim 2, wherein the compensation controller circuit comprises:
   a first compensation input terminal receiving the comparison result; and
   a second compensation input terminal receiving the compensation enable signal,
   wherein the comparison result and the compensation enable signal jointly enable the compensation controller circuit.

4. The voltage supply circuit of claim 3,
   wherein the compensation controller circuit further comprises a third compensation input terminal receiving the compensation value control signal; and
   wherein the compensation controller circuit generates the voltage control signal jointly according to the comparison result, the compensation enable signal, and the compensation value control signal.

5. The voltage supply circuit of claim 4, wherein the comparison result, the compensation enable signal, and the compensation value control signal jointly control a plurality of logic gates to generate the voltage control signal.

6. The voltage supply circuit of claim 5, wherein the compensation value control signal comprises a plurality of control commands to the plurality of logic gates to generate the voltage control signal.

7. The voltage supply circuit of claim 4, wherein the voltage control signal comprises at least one switching command to control at least one switch in the voltage regulation circuit.

8. The voltage supply circuit of claim 1, wherein the compensation controller circuit comprises:
   a first logic gate receiving the comparison result and the compensation enable signal, and outputting a first logic value;
   a second logic gate receiving the first logic value and a first portion of the compensation value control signal, and outputting a first portion of the voltage control signal; and
   a third logic gate receiving the first logic value and a second portion of the compensation value control signal, and outputting a second portion of the voltage control signal.

9. The voltage supply circuit of claim 8, wherein the compensation value control signal comprises a digital signal, the first portion of the compensation value control signal comprises a first bit of the digital signal, and the second portion of the compensation value control signal comprises a second bit of the digital signal.

10. The voltage supply circuit of claim 8, wherein the first logic gate comprises an AND gate, the second logic gate comprises a NAND gate, and the third logic gate comprises a NAND gate.

11. The voltage supply circuit of claim 1, wherein the voltage regulation circuit further comprises an output terminal for outputting the voltage output, and a voltage level of the voltage output is adjustable by switching on/off the first switch and/or the second switch.

12. A three-dimensional (3D) memory device, comprising:
   a memory cell array for storing data; and a peripheral circuit coupled to the memory cell array and comprising a voltage supply circuit providing a voltage source in the peripheral circuit, the voltage supply circuit comprising:
a temperature compensation circuit comprising:
a comparator circuit comparing a device temperature value with a reference value to output a comparison result; and
a compensation controller circuit receiving the comparison result, a compensation value control signal, and a compensation enable signal, and outputting a voltage control signal; and
a voltage regulation circuit receiving the voltage control signal and providing a voltage output according to the voltage control signal, wherein the voltage regulation circuit comprises:
a resistor string comprising a first resistor and a second resistor in series connection;
a first switch coupled to two ends of the first resistor; and
a second switch coupled to two ends of the second resistor.

13. The 3D memory device of claim 12, wherein the comparator circuit comprises:
a first comparator input terminal receiving the device temperature value;
a second comparator input terminal receiving the reference value; and
a comparator output terminal outputting the comparison result; and
wherein when the device temperature value is lower than the reference value, the comparison result comprises a comparison flag to the compensation controller circuit.

14. The 3D memory device of claim 13, wherein the compensation controller circuit comprises:
a first compensation input terminal receiving the comparison result;
a second compensation input terminal receiving the compensation enable signal; and
a third compensation input terminal receiving the compensation value control signal,
wherein the compensation controller circuit generates the voltage control signal jointly according to the comparison result, the compensation enable signal, and the compensation value control signal.

15. The 3D memory device of claim 14, wherein the comparison result, the compensation enable signal, and the compensation value control signal jointly control a plurality of logic gates to generate the voltage control signal.

16. The 3D memory device of claim 12, wherein the voltage regulation circuit further comprises an output terminal for outputting the voltage output, and a voltage level of the voltage output is adjustable by switching on/off the first switch and/or the second switch.

17. A peripheral circuit comprising:
a voltage supply circuit, comprising:
a temperature compensation circuit comprising:
a comparator circuit comparing a device temperature value with a reference value to output a comparison result; and
a compensation controller circuit receiving the comparison result and a compensation enable signal, and outputting a voltage control signal according to the comparison result; and
a voltage regulation circuit receiving the voltage control signal and providing a voltage output according to the voltage control signal; and
a page buffer receiving the voltage output from the voltage supply circuit,
wherein the voltage regulation circuit comprises:
a resistor string comprising a first resistor and a second resistor in series connection;
a first switch coupled to two ends of the first resistor; and
a second switch coupled to two ends of the second resistor.

18. The peripheral circuit of claim 17, wherein the comparator circuit comprises:
a first comparator input terminal receiving the device temperature value;
a second comparator input terminal receiving the reference value; and
a comparator output terminal outputting the comparison result; and
wherein when the device temperature value is lower than the reference value, the comparison result comprises a comparison flag to the compensation controller circuit.

* * * * *